United States Patent
Wu et al.

(10) Patent No.: US 10,367,517 B2
(45) Date of Patent: Jul. 30, 2019

(54) ANALOG TO DIGITAL CONVERSION APPARATUS AND ANALOG TO DIGITAL CONVERTER CALIBRATION METHOD OF THE SAME

(71) Applicant: Realtek Semiconductor Corporation, Hsinchu (TW)

(72) Inventors: Ying-Cheng Wu, Zhubei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/026,315

(22) Filed: Jul. 3, 2018

(65) Prior Publication Data

US 2019/0097645 A1    Mar. 28, 2019

(30) Foreign Application Priority Data

Sep. 28, 2017    (TW) .............................. 106133444 A

(51) Int. Cl.
   *H03M 1/10*    (2006.01)
   *H03M 1/06*    (2006.01)
   *H03M 1/44*    (2006.01)

(52) U.S. Cl.
   CPC ....... *H03M 1/1057* (2013.01); *H03M 1/0614* (2013.01); *H03M 1/442* (2013.01)

(58) Field of Classification Search
   CPC ... H03M 1/1057; H03M 1/0614; H03M 1/442
   (Continued)

(56) References Cited

U.S. PATENT DOCUMENTS 4,338,589 A * 7/1982 Engel .................. H03M 1/10
                                                    341/120
6,424,276 B1   7/2002 Munoz et al.
(Continued)

FOREIGN PATENT DOCUMENTS

CN    102082572 A    6/2011
TW    200832937 A    8/2008

OTHER PUBLICATIONS

Michael Inerfield et al., "An 11.5-ENOB 100-MS/s 8mW Dual-Reference SAR ADC in 28nm CMOS", Symposium on VLSI Circuits Digest of Technical papers, IEEE, 2014.
(Continued)

*Primary Examiner* — Peguy Jean Pierre
(74) *Attorney, Agent, or Firm* — Locke Lord LLP; Tim Tingkang Xia, Esq.

(57) ABSTRACT

An analog to digital conversion apparatus that includes an analog to digital converter (ADC), a linearity calculating module and a calibration module is provided. The ADC includes a capacitor array, a comparator and a control circuit. The capacitor array receives an input signal to perform a capacitor-switching to generate a capacitor array output signal. The comparator compares the capacitor array output signal and a comparing signal to generate a digital code output result. The control circuit controls the capacitor-switching according to the digital code output result. The linearity calculating module generates a linearity related parameter according to the digital code output result. The calibration module generates a weighting parameter according to the linearity related parameter when the linearity related parameter is not within a predetermined range to adjust the digital code output result based on the weighting parameter to generate an adjusted digital code output result.

16 Claims, 7 Drawing Sheets

(58) Field of Classification Search
USPC .......................................... 341/155, 120, 172
See application file for complete search history.

(56) References Cited

U.S. PATENT DOCUMENTS

| | | | |
|---|---|---|---|
| 6,486,806 B1 | 11/2002 | Munoz et al. | |
| 6,590,517 B1 | 7/2003 | Swanson | |
| 7,609,184 B2* | 10/2009 | Kuramochi | H03M 1/1047 |
| | | | 341/118 |
| 7,821,435 B2* | 10/2010 | Fan | H03M 1/1004 |
| | | | 341/118 |
| 8,487,794 B2* | 7/2013 | Huang | H03M 1/1061 |
| | | | 341/120 |
| 10,003,352 B2* | 6/2018 | Li | H03M 1/0678 |

OTHER PUBLICATIONS

Chun C. Lee et al., "A 12b 70MS/s SAR ADC with Digital Startup Calibration in 14nm CMOS", Symposium on VLSI Circuits Digest of Technical papers, 2015.

* cited by examiner and a control circuit of the ADC. A linearity related parameter is generated according to the digital code output result by a linearity calculating module of the ADC. A weighting parameter is generated according to the linearity related parameter when the linearity related parameter is not within a predetermined range to adjust the digital code output result based on the weighting parameter to generate an adjusted digital code output result by a calibration module of the ADC.

ANALOG TO DIGITAL CONVERSION APPARATUS AND ANALOG TO DIGITAL CONVERTER CALIBRATION METHOD OF THE SAME

RELATED APPLICATIONS

This application claims priority to Taiwan Application Serial Number 106133444, filed Sep. 28, 2017, which is herein incorporated by reference.

BACKGROUND

Field of Invention

The present disclosure relates to a signal conversion technology. More particularly, the present disclosure relates to an analog to digital conversion apparatus and an analog to digital converter calibration method of the same.

Description of Related Art

An analog to digital converter is an element configured to convert a continuous signal of analog form to a discrete signal of digital form. A successive approximation ADC (SRA ADC) uses the concept of binary search method to gradually approximate an input voltage. A capacitor array is often disposed in the SRA ADC to perform comparison based on the switching activities of the capacitor array. However, the inaccuracy of the voltage levels is easy to be generated due to the mismatch of the capacitor array and causes error that results in false digital codes.

Accordingly, what is needed is an analog to digital conversion apparatus and an analog to digital converter calibration method of the same to address the issues mentioned above.

SUMMARY

An aspect of the present disclosure is to provide an analog to digital conversion apparatus. The analog to digital conversion apparatus includes an analog to digital converter (ADC), a linearity calculating module and a calibration module. The ADC includes a capacitor array, a comparator and a control circuit. The capacitor array is configured to receive an input signal to perform a capacitor-switching to generate a capacitor array output signal. The comparator is configured to compare the capacitor array output signal and a comparing signal to generate a digital code output result. The control circuit is configured to control the capacitor-switching according to the digital code output result. The linearity calculating module is configured to generate a linearity related parameter according to the digital code output result. The calibration module is configured to generate a weighting parameter according to the linearity related parameter when the linearity related parameter is not within a predetermined range to adjust the digital code output result based on the weighting parameter to generate an adjusted digital code output result.

Another aspect of the present disclosure is to provide an analog to digital converter calibration method that includes the steps outlined below. An input signal is received to perform a capacitor-switching to generate a capacitor array output signal by a capacitor array of an ADC. The capacitor array output signal and a comparing signal is compared to generate a digital code output result by a comparator of the ADC. The capacitor-switching is controlled according to the These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
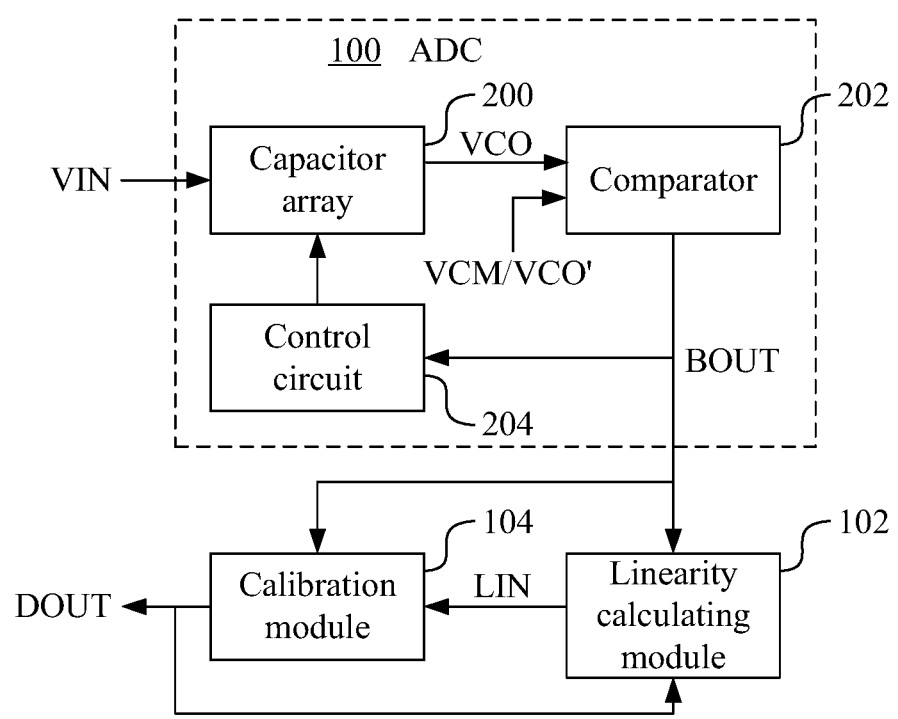
FIG. 1 is a block diagram of an analog to digital conversion apparatus in an embodiment of the present disclosure.

Reference is made to FIG. 1. FIG. 1 is a block diagram of an analog to digital conversion apparatus 1 in an embodiment of the present disclosure. The analog to digital conversion apparatus 1 includes an ADC 100, a linearity calculating module 102 and a calibration module 104.

The ADC 100 is configured to receive an input signal VIN having an analog form to perform an analog to digital conversion and generate a digital code output result BOUT. The digital code output result BOUT is represented by M bits, in which the M bits include a most significant bit (MSB) and M−1 bits behind the MSB.

In an embodiment, the ADC 100 includes a capacitor array 200, a comparator 202 and a control circuit 204.

Figure 2A:
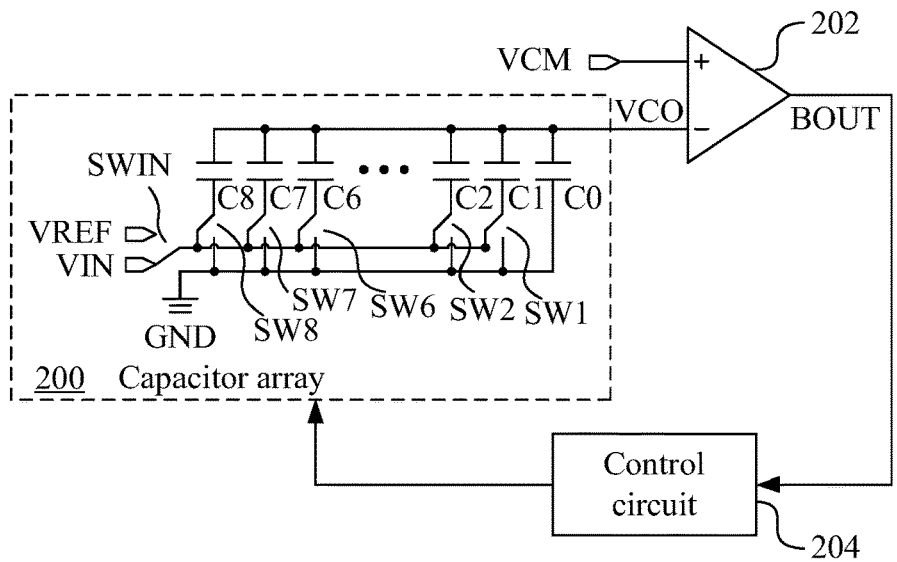
FIG. 2A and FIG. 2B are detailed block diagrams of the ADC in an embodiment of the present invention.
Figure 2B:
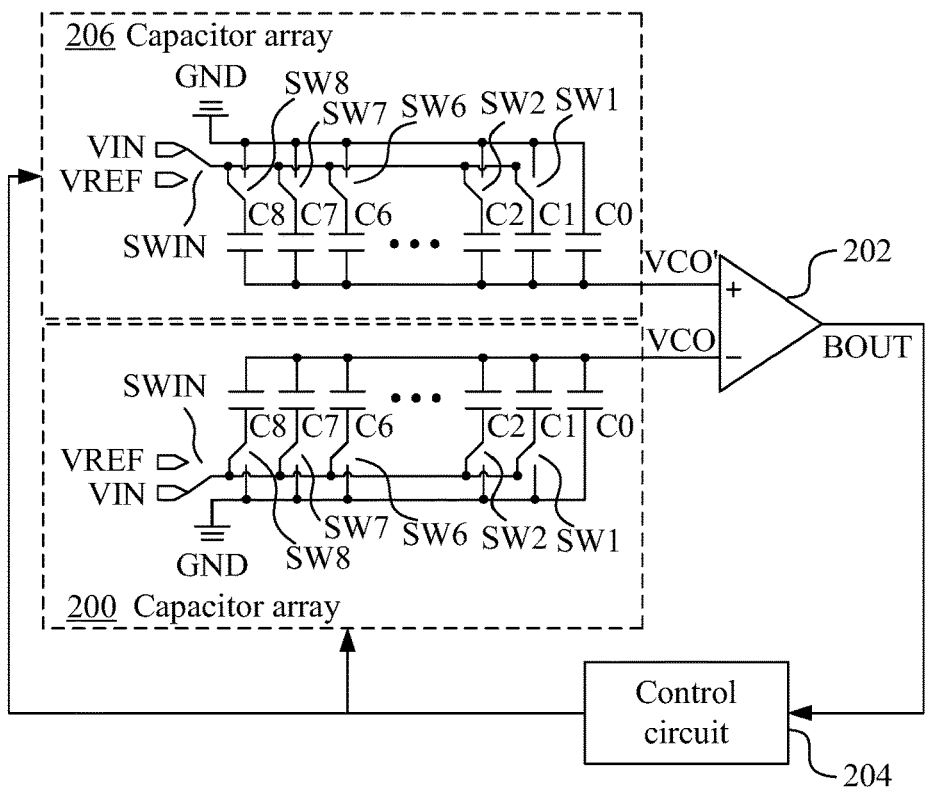

Reference is now made to FIG. 2A and FIG. 2B. FIG. 2A and FIG. 2B are detailed block diagrams of the ADC 100 in an embodiment of the present invention.

As illustrated in FIG. 2A, the capacitor array 200 includes a plurality of capacitors electrically coupled in parallel, such as but not limited to capacitors C0-C8. In an embodiment, the capacitances of the capacitors C0-C8 are in proportion to each other. For example, the capacitors C0 and C1 have identical capacitance. The capacitance of the capacitor C2 is the sum of the capacitances of the capacitors C0 and C1 (i.e. the twice of the capacitance of the capacitor C0). In an embodiment, the capacitance of the capacitor C2 can be slightly smaller than the sum of the capacitances of the capacitors C0 and C1.

Similarly, the capacitance of the capacitor C3 is the sum of the capacitances of the capacitors C0 to C2 (i.e. the four times of the capacitance of the capacitor C0), so on and so forth. Each of the capacitors corresponds to a bit. Accordingly, the capacitance of the capacitor C8 that corresponds to the most significant bit is $2^8$ times of the capacitor C0.

The capacitor array 200 can receive the input signal VIN or the reference voltage VREF through the switching activity of the switch unit SWIN. Each of the capacitors C0-C8 can be electrically coupled to the reference voltage VREF or the ground level GND based on the switching activities of the switch units SW1-SW8. In an embodiment, the switch unit SWIN is first switched to receive the input signal VIN and switched to receive the reference voltage VREF subsequently. In accompany with the switching activities of the switch units SW1-SW8 to switch the capacitors C0-C8, a capacitor array output signal VC0 is generated.

The comparator 202 is electrically coupled to the capacitor array 200 and is configured to compare the capacitor array output signal VC0 and a comparing signal VCM to generate the digital code output result BOUT. In an embodiment, the comparing signal VCM can selectively be a fixed signal or a sampling result of the input signal VIN. The control circuit 204 further adjusts the capacitor array 200 according to the digital code output result BOUT such that the digital code corresponding to the input signal VIN is outputted bit by bit from the highest digit to the lowest digit to approximate the input signal VIN based on the comparison result.

As illustrated in FIG. 2B, in the present embodiment, the ADC 100 further includes another capacitor array 206 besides the capacitor array 200. In an embodiment, the configuration and the operation of the capacitor array 206 are identical to the capacitor array 200. As a result, the detail of the configuration and the operation of the capacitor array 206 is not described herein. In the present embodiment, the comparator 202 is configured to compare the capacitor array output signal VC0 of the capacitor array 200 and the capacitor array output signal VC0' of the capacitor array 206 to generate the digital code output result BOUT. The control circuit 204 further adjusts the capacitor array 200 the capacitor array 206 according to the digital code output result BOUT such that the digital code corresponding to the input signal VIN is outputted bit by bit from the highest digit to the lowest digit.

It is appreciated that the ADC 100 illustrated in FIG. 2A and FIG. 2B is merely an example. In other embodiments, the ADC 100 can be implemented by other configurations or include other components. The present invention is not limited thereto.

The linearity calculating module 102 is configured to generate a linearity related parameter LIN according to the digital code output result BOUT.

The calibration module 104 is configured to generate a weighting parameter (not illustrated) according to the linearity related parameter LIN when the linearity related parameter LIN is not within a predetermined range to adjust the digital code output result BOUT based on the weighting parameter to generate an adjusted digital code output result DOUT.

In an embodiment, the weighting parameter corresponds to the capacitor that corresponds to the most significant bit (MSB) in the capacitor array 200, e.g. the capacitor C8.

In an embodiment, when the input signal is a single tone signal, the linearity related parameter LIN is related to a total harmonic distortion (THD). When the sum of the harmonics is smaller, the performance of the linearity is better.

As a result, when the input signal is a single tone signal and the linearity related parameter LIN is related to the total harmonic distortion, the calibration module 104 generates the weighting parameter to adjust the digital code output result BOUT to generate the adjusted digital code output result DOUT when the sum of the harmonics is not smaller than a predetermined range.

Figure 3A:
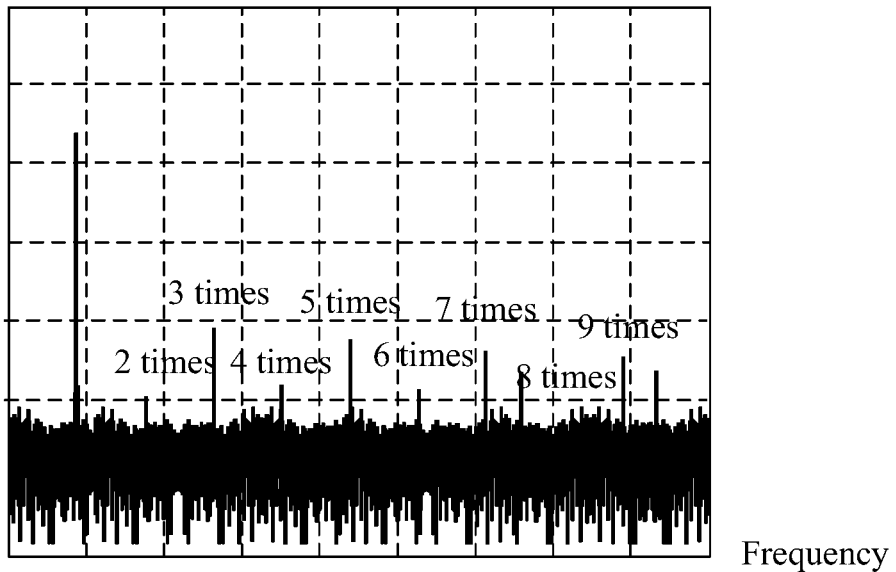
FIG. 3A and FIG. 3B are diagrams of the waveforms of total harmonic distortion before and after the calibration performed by the calibration module when the input signal is the single tone signal in an embodiment of the present invention.
Figure 3B:
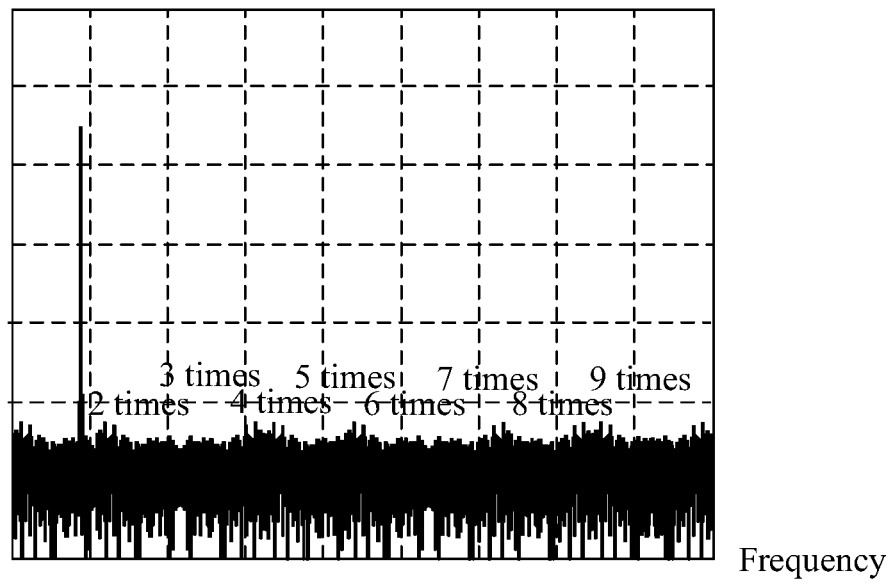

Reference is now made to FIG. 3A and FIG. 3B. FIG. 3A and FIG. 3B are diagrams of the waveforms of total harmonic distortion before and after the calibration performed by the calibration module 104 when the input signal is the single tone signal in an embodiment of the present invention.

As illustrated in FIG. 3A and FIG. 3B, the values from the second harmonics to the ninth harmonics are larger and a plurality of impulses are formed before the calibration performed by the calibration module 104. The sum of the harmonics is larger. After the calibration performed by the calibration module 104, the values from the second harmonics to the ninth harmonics become smaller. The sum of the harmonics is smaller and the performance of the linearity is better.

When the analog to digital conversion apparatus 1 is used in a multi-carrier system, the input signal is a multi tone signal. Under such a condition, the linearity related parameter LIN is related to a multi tone power ratio (MTPR). When difference between the signal strength of the frequencies that exist in the multi tone power ratio and the signal strength of the frequencies that do not exist in the multi tone power ratio is larger, the performance of the linearity is better.

As a result, when the input signal is a multi tone signal and the linearity related parameter LIN is related to the multi tone power ratio, the calibration module 104 generates the weighting parameter to adjust the digital code output result BOUT to generate the adjusted digital code output result DOUT when the difference of the signal strengths described above is not larger than a predetermined range.

Figure 4A:
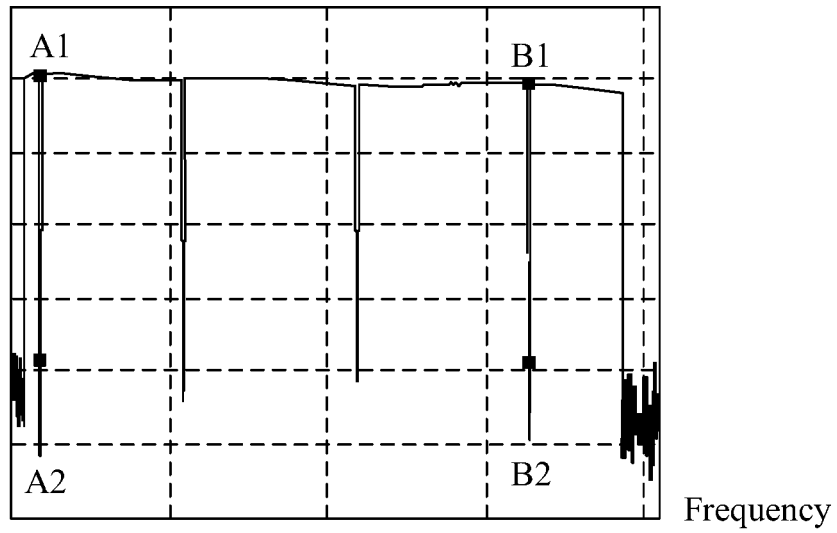
FIG. 4A and FIG. 4B are diagrams of the waveforms of multi tone power ratio before and after the calibration performed by the calibration module when the input signal is the multi tone signal in an embodiment of the present invention.
Figure 4B:
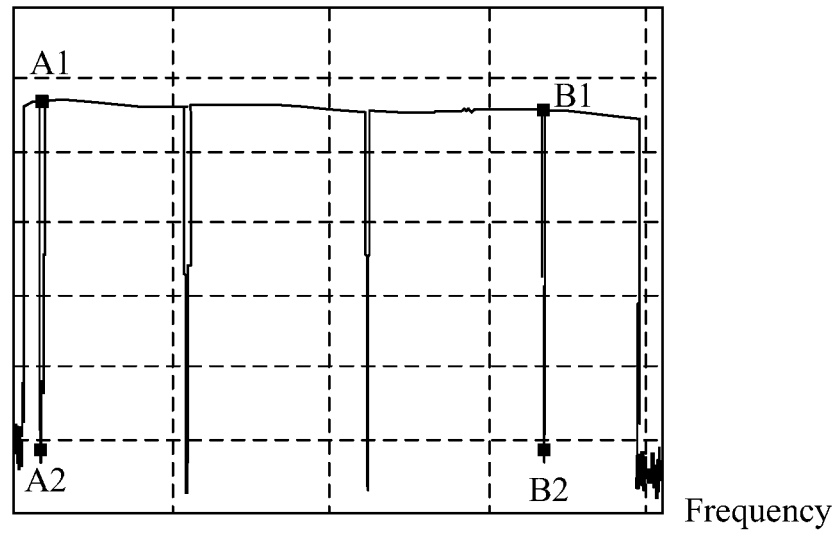

FIG. 4A and FIG. 4B are diagrams of the waveforms of multi tone power ratio before and after the calibration performed by the calibration module 104 when the input signal is the multi tone signal in an embodiment of the present invention. The units of the X-axis and the Y-axis in FIG. 4A and FIG. 4B are frequency and decibel and each of the units on the X-axis and the Y-axis are respectively the same.

As illustrated in FIG. 4A and FIG. 4B, the input signal VIN which is the multi tone signal has the components of the frequencies corresponding to the point A1 and the point B1 and does not have the components of the frequencies corresponding to the point A2 and the point B2.

As a result, before the calibration performed by the calibration module 104, the difference of the signal strengths between the points A1 and A2 and the difference of the signal strengths between the points B1 and B2 are both approximately 4 units (corresponding to 4 units on the Y-axis). After the calibration performed by the calibration module 104, the difference of the signal strengths between the points A1 and A2 and the difference of the signal strengths between the points B1 and B2 are both increased to an amount between 4.5 units to 5 units. As a result, the difference of the signal strengths after the calibration is larger than the difference of the signal strengths before the calibration. A better performance of the linearity is accomplished.

In an embodiment, the calibration module 104 feeds the adjusted digital code output result DOUT back to the linearity calculating module 102 such that the linearity calculating module 102 generates the linearity related parameter LIN according to the adjusted digital code output result DOUT.

The calibration module 104 is configured to keep adjusting the weighting parameter according to the linearity related parameter LIN when the linearity related parameter LIN is not within the predetermined range to adjust the adjusted digital code output result DOUT based on the weighting parameter. The adjusting mechanism based on feedback can be performed until the linearity related parameter LIN is within the predetermined range.

In some approaches, additional modules such as a comparator, a calibration control circuit, a successive approximation register and a digital to analog converter for calibration are required to perform control and calibration based on the charges of the capacitors in the capacitor array of the ADC. When the required accuracy is higher, the complexity of the circuit is higher and the area of the circuit is larger. In comparison, the advantage of the present invention is to use the calibration module 104 in the analog to digital conversion apparatus to perform calibration on the digital code output result BOUT based on the linearity related parameter LIN generated by the linearity calculating module 102. The complexity of the design is greatly reduced.

Figure 5:
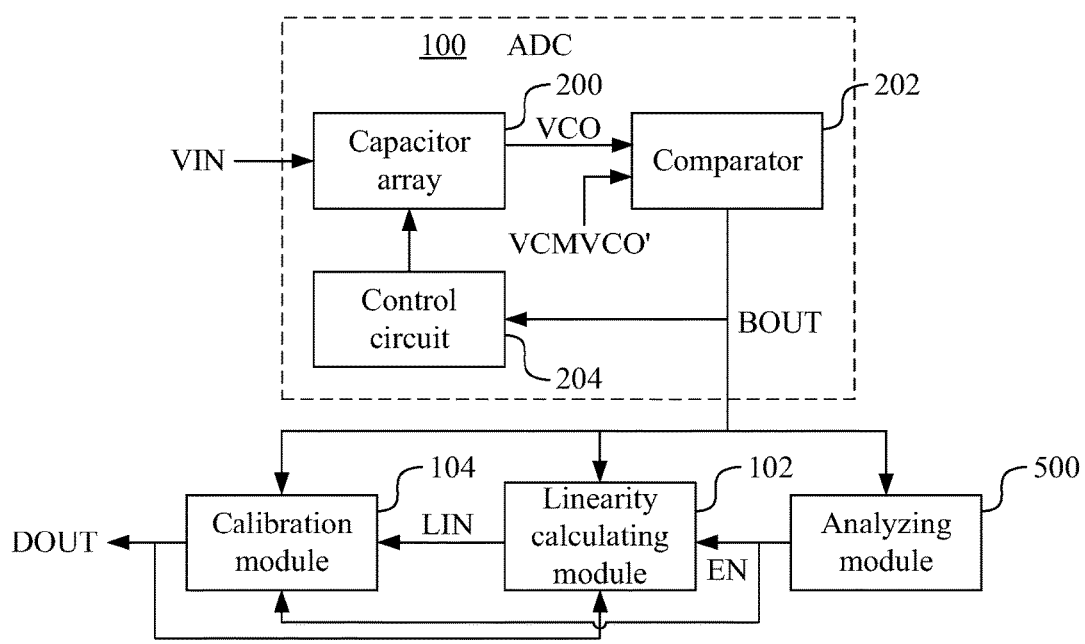
FIG. 5 is a block diagram of an analog to digital conversion apparatus in an embodiment of the present invention.

Reference is now made to FIG. 5. FIG. 5 is a block diagram of an analog to digital conversion apparatus 5 in an embodiment of the present invention.

Similar to the analog to digital conversion apparatus 1 illustrated in FIG. 1, the analog to digital conversion apparatus 5 includes the ADC 100, the linearity calculating module 102 and the calibration module 104. However, in the present embodiment, the digital conversion apparatus 5 further includes an analyzing module 500.

In an embodiment, the analyzing module 500 and the linearity calculating module 102 can be integrated in the same system on a chip (SoC) or a digital signal processor (DSP). The analyzing module 500 is configured to receive the digital code output result BOUT to perform analysis to determine an occurrence of a code-missing condition when the digital code output result BOUT is not continuous.

More specifically, the analyzing module 500 is configured to generate a histogram, a digital code integral nonlinearity (INL) error curve or a digital code differential nonlinearity (DNL) error curve based on the digital code output result BOUT and determine whether the code-missing condition occurs.

Figure 6A:
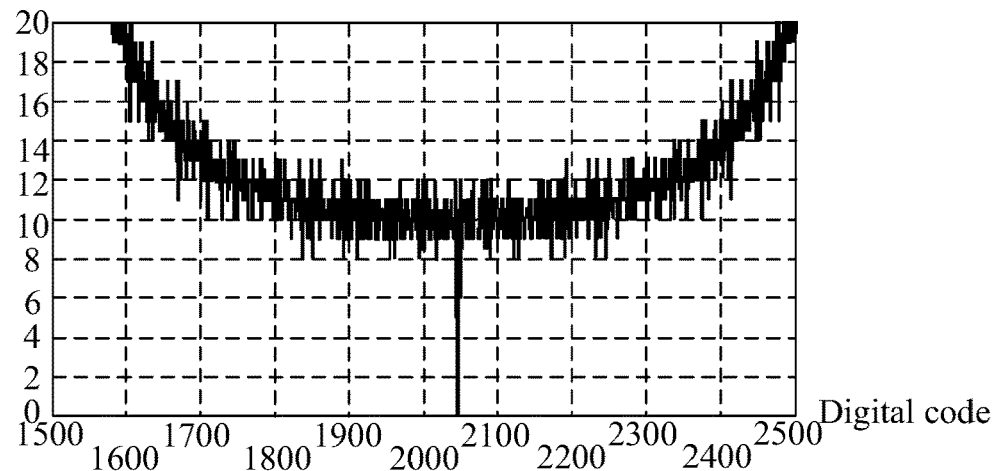
FIG. 6A is a histogram generated by the analyzing module based on the digital code output result in an embodiment of the present invention.

Reference is now made to FIG. 6A. FIG. 6A is a histogram generated by the analyzing module 500 based on the digital code output result BOUT in an embodiment of the present invention.

In FIG. 6A, the X-axis corresponds to the lowest digital code to the highest digital code. The Y-axis corresponds to the number of appearance of each of the digital codes.

Take the capacitor array that includes 12 capacitors as an example, such a capacitor array can generate digital codes having 12 digits covering the range from 0 to 4095. In FIG. 4A, the digital codes of the range 1500 to 2500 are illustrated. The number of appearance of the digital code 2048, which is the median value, is 0. As a result, the analyzing module 500 can determine that the digital code output result BOUT is not continuous at the position of the digital code 2048.

Figure 6B:
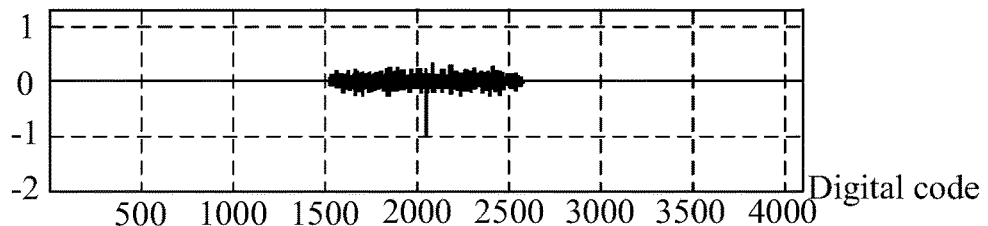
FIG. 6B and FIG. 6C are respectively diagrams of the digital code integral nonlinearity error curve and the digital code differential nonlinearity error curve generated by the analyzing module according to the digital code output result in an embodiment of the present invention.
Figure 6C:
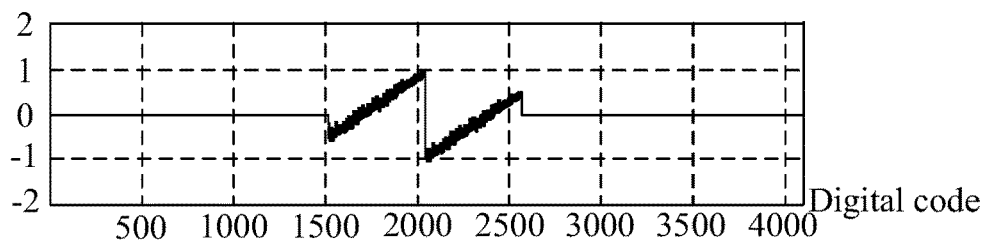

Reference is now made to FIG. 6B and FIG. 6C. FIG. 6B and FIG. 6C are respectively diagrams of the digital code integral nonlinearity error curve and the digital code differential nonlinearity error curve generated by the analyzing module 500 according to the digital code output result BOUT in an embodiment of the present invention.

In FIG. 6B and FIG. 6C, the X-axis corresponds to the lowest digital code to the highest digital code. The Y-axis corresponds to the least significant bit (LSB). Take the capacitor array that includes 12 capacitors as an example, such a capacitor array can generate digital codes having 12 digits covering the range from 0 to 4095. In FIG. 6B and FIG. 6C, the digital codes of the range 0 to 4000 are illustrated. The curves have discontinuous condition at the median value corresponding to the digital code 2048. As a result, the analyzing module 500 can determine that the digital code output result BOUT is not continuous at the position of the digital code 2048.

In the present embodiment, the analyzing module 500 generates an enabling signal EN to the linearity calculating module 102 and the calibration module 104 when the occurrence of the code-missing condition is determined such that the linearity calculating module 102 and the calibration module 104 are operated when the code-missing condition occurs.

Figure 7:
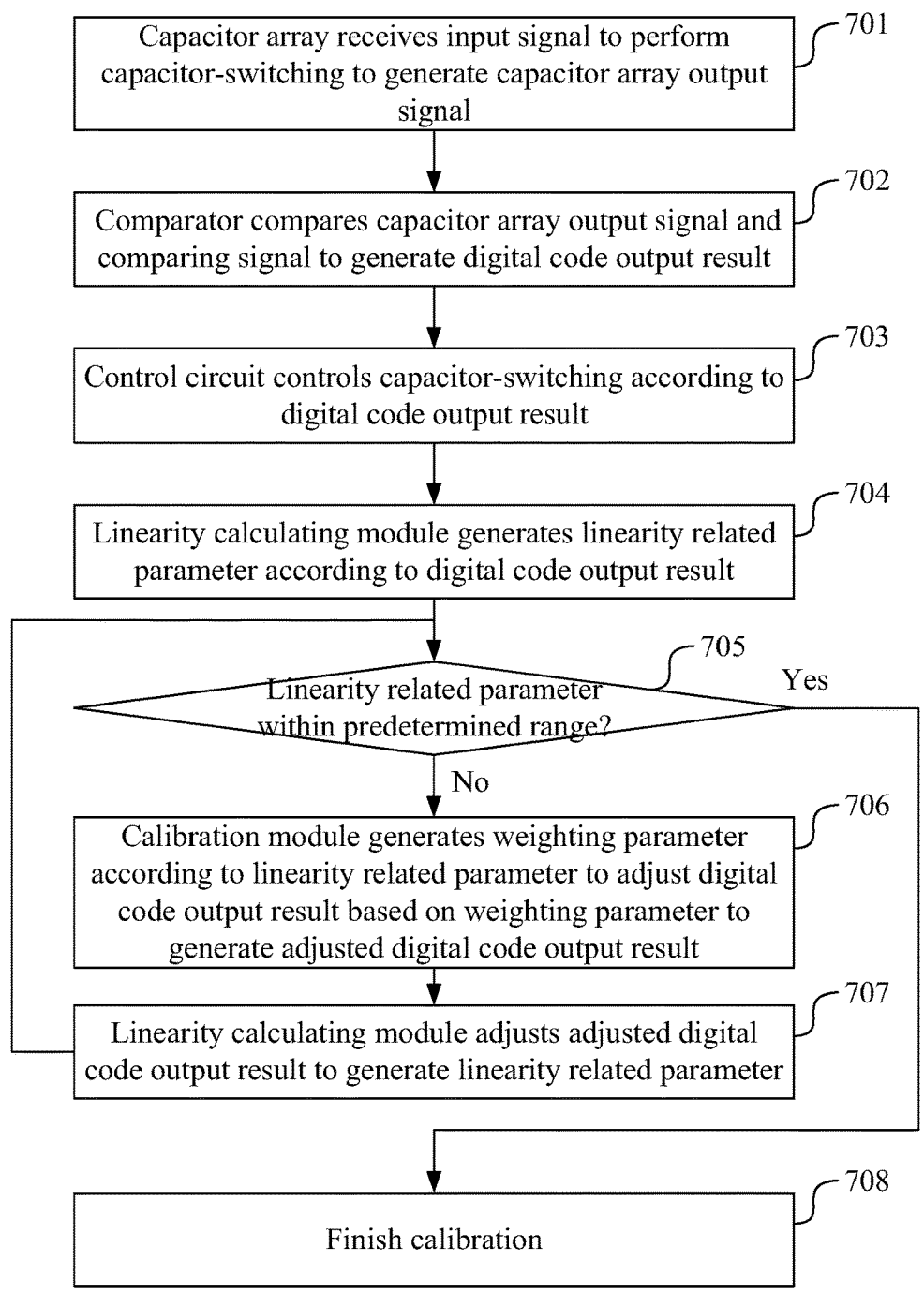
FIG. 7 is a flow chart of an analog to digital converter calibration method in an embodiment of the present invention.

Reference is now made to FIG. 7. FIG. 7 is a flow chart of an analog to digital converter calibration method 700 in an embodiment of the present invention. The analog to digital converter calibration method 700 can be used in such as, but not limited to the analog to digital conversion apparatus 1 illustrated in FIG. 1. The analog to digital converter calibration method 700 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 701, the capacitor array 200 of the ADC 100 receives the input signal VIN to perform the capacitor-switching to generate the capacitor array output signal VCO.

In step 702, the comparator 202 of the ADC 100 compares the capacitor array output signal VC0 and the comparing signal VCM to generate the digital code output result BOUT.

In step 703, the control circuit 204 of the ADC 100 controls the capacitor-switching according to the digital code output result BOUT.

In step 704, the linearity calculating module 102 of the ADC 100 generates the linearity related parameter LIN according to the digital code output result BOUT.

In step 705, the calibration module 104 determines that whether the linearity related parameter LIN is within the predetermined range.

In step 706, the calibration module 104 of the ADC 100 generates the weighting parameter according to the linearity related parameter LIN when the linearity related parameter LIN is not within the predetermined range to adjust the digital code output result BOUT based on the weighting parameter to generate the adjusted digital code output result DOUT.

In step 707, the linearity calculating module 102 adjusts the adjusted digital code output result DOUT to generate the linearity related parameter LIN.

Subsequently, the flow goes back to step 705 such that the calibration module 104 determines that whether the linearity related parameter LIN is within the predetermined range again.

When the linearity related parameter LIN is not within the predetermined range, the flow goes to steps 706 and 707 again to keep adjusting the adjusted digital code output result DOUT. When the linearity related parameter LIN is within the predetermined range, the flow goes to step 708. The calibration is finished.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An analog to digital conversion apparatus, comprising:
   an analog to digital converter (ADC) comprising;
   a capacitor array configured to receive an input signal to perform a capacitor-switching to generate a capacitor array output signal;
   a comparator configured to compare the capacitor array output signal and a comparing signal to generate a digital code output result; and
   a control circuit configured to control the capacitor-switching according to the digital code output result;
   a linearity calculating module configured to generate a linearity related parameter according to the digital code output result; and
   a calibration module configured to generate a weighting parameter according to the linearity related parameter when the linearity related parameter is not within a predetermined range to adjust the digital code output result based on the weighting parameter to generate an adjusted digital code output result.

2. The analog to digital conversion apparatus of claim 1, wherein the linearity calculating module is further configured to generate the linearity related parameter according to the adjusted digital code output result, and the calibration module is configured to adjust the weighting parameter according to the linearity related parameter when the linearity related parameter is not within the predetermined range to adjust the adjusted digital code output result based on the weighting parameter.

3. The analog to digital conversion apparatus of claim 1, wherein the input signal is a single tone signal, and the linearity related parameter is related to a total harmonic distortion (THD).

4. The analog to digital conversion apparatus of claim 1, wherein the input signal is a multi tone signal, and the linearity related parameter is related to a multi tone power ratio (MTPR).

5. The analog to digital conversion apparatus of claim 1, further comprises an analyzing module configured to receive the digital code output result to perform analysis such that when the digital code output result is not continuous, an occurrence of a code-missing condition is determined;
   wherein the linearity calculating module and the calibration module are operated when the code-missing condition occurs.

6. The analog to digital conversion apparatus of claim 5, wherein the analyzing module is configured to generate a histogram, a digital code integral nonlinearity (INL) error curve or a digital code differential nonlinearity (DNL) error curve based on the digital code output result and determine whether the code-missing condition occurs.

7. The analog to digital conversion apparatus of claim 1, wherein the comparing signal is another capacitor array output signal and a reference signal.

8. The analog to digital conversion apparatus of claim 1, wherein the weighting parameter corresponds to a capacitor that corresponds to a most significant bit (MSB) in the capacitor array.

9. An analog to digital converter calibration method, comprising:
   receiving an input signal to perform a capacitor-switching to generate a capacitor array output signal by a capacitor array of an ADC;
   comparing the capacitor array output signal and a comparing signal to generate a digital code output result by a comparator of the ADC;
   controlling the capacitor-switching according to the digital code output result by a control circuit of the ADC;
   generating a linearity related parameter according to the digital code output result by a linearity calculating module of the ADC; and
   generating a weighting parameter according to the linearity related parameter when the linearity related parameter is not within a predetermined range to adjust the digital code output result based on the weighting parameter to generate an adjusted digital code output result by a calibration module of the ADC.

10. The analog to digital converter calibration method of claim 9, further comprising:
    generating the linearity related parameter according to the adjusted digital code output result by the linearity calculating module; and
    adjusting the weighting parameter according to the linearity related parameter when the linearity related parameter is not within the predetermined range to adjust the adjusted digital code output result based on the weighting parameter by the calibration module.

11. The analog to digital converter calibration method of claim 9, wherein the input signal is a single tone signal, and the linearity related parameter is related to a total harmonic distortion (THD).

12. The analog to digital converter calibration method of claim 9, wherein the input signal is a multi tone signal, and the linearity related parameter is related to a multi tone power ratio (MTPR).

13. The analog to digital converter calibration method of claim 9, further comprising:
    receiving the digital code output result to perform analysis such that when the digital code output result is not continuous, an occurrence of a code-missing condition is determined by the an analyzing module;
    operating the linearity calculating module and the calibration module when the code-missing condition occurs.

14. The analog to digital converter calibration method of claim 13, further comprising:

generating a histogram, a digital code integral nonlinearity (INL) error curve or a digital code differential nonlinearity (DNL) error curve based on the digital code output result and determining whether the code-missing condition occurs by the analyzing module.

15. The analog to digital converter calibration method of claim 9, wherein the comparing signal is another capacitor array output signal and a reference signal.

16. The analog to digital converter calibration method of claim 9, wherein the weighting parameter corresponds to a capacitor that corresponds to a most significant bit (MSB) in the capacitor array.

* * * * *